DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JULY 20, 1971

888 O.G. 705

T888,007

PHOTO-SENSITIVE POLYMERS

Richard C. Tuites, Thomas M. Laakso, Jack L. R. Williams, and Louis M. Minsk, all of Kodak Park, Rochester, N.Y. 14650

Filed Sept. 29, 1970, Ser. No. 76,630
**Int. Cl. G03c *1/68***
U.S. Cl. 96—115
No Drawing. 18 Pages Specification

There are disclosed light-sensitive polymers containing recurring groups having the formula

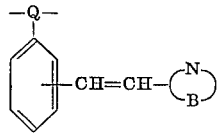

and quaternary salts thereof having the formula

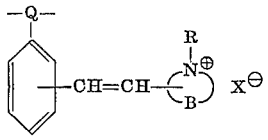

wherein Q is a unit in the parent polymer chain e.g., $$-CH_2\underset{|}{C}H-$$

R is a lower alkyl group, $X^{\ominus}$ is an anion, and B represents the atoms necessary to complete a pyridine or quinoline moiety, the group ⟨CH=CH⟩ being attached to a ring carbon atom in the nitrogen-containing ring. A method is disclosed for preparing the quaternary salts which comprises reacting a polymer of vinyltoluene with N-bromosuccinimide in the presence of benzoyl peroxide to brominate the methyl group on the toluene ring, reacting the resultant product with dimethyl sulfoxide in the presence of sodium bicarbonate to convert the bromomethyl groups to aldehyde groups and thereafter condensing the aldehyde groups on the polymer with an aromatic, quaternized compound such as the methyl p-toluene sulfonate quaternary salt of 2-picoline. The light-sensitive polymers are useful in photomechanical reproduction processes such as for lithographic purposes or as photoresists.